US010811940B2

(12) United States Patent
Higashide et al.

(10) Patent No.: US 10,811,940 B2
(45) Date of Patent: Oct. 20, 2020

(54) MOTOR DEVICE (71) Applicant: JTEKT CORPORATION, Osaka-shi, Osaka (JP)

(72) Inventors: Tomohiro Higashide, Toba (JP); Yuto Sato, Nagoya (JP)

(73) Assignee: JTEKT CORPORATION, Osaka-shi (JP)

( * ) Notice: Subject to any disclaimer, the term of this patent is extended or adjusted under 35 U.S.C. 154(b) by 134 days.

(21) Appl. No.: 16/158,482

(22) Filed: Oct. 12, 2018

(65) Prior Publication Data

US 2019/0123621 A1 Apr. 25, 2019

(30) Foreign Application Priority Data

Oct. 19, 2017 (JP) ................................ 2017-202774

(51) Int. Cl.
| *H02K 11/02* | (2016.01) |
| *H02K 11/215* | (2016.01) |
| *H02K 11/30* | (2016.01) |
| *H02K 11/01* | (2016.01) |
| *H02K 11/33* | (2016.01) |
| *H03H 1/00* | (2006.01) |
| *H02K 5/06* | (2006.01) |

(52) U.S. Cl.
CPC ............. *H02K 11/02* (2013.01); *H02K 11/01* (2016.01); *H02K 11/215* (2016.01); *H02K 11/30* (2016.01); *H02K 11/33* (2016.01); *H03H 1/0007* (2013.01); *H02K 5/06* (2013.01); *H02K 2211/03* (2013.01)

(58) Field of Classification Search
CPC ...... H02K 11/01; H02K 11/02; H02K 11/215; H02K 11/30; H02K 11/33; H02K 5/06; H02K 2211/03; H03H 1/0007
See application file for complete search history.

(56) References Cited

U.S. PATENT DOCUMENTS

| 2014/0339966 A1* | 11/2014 | Tomizawa ............... H02K 5/22 310/68 D |
| 2016/0218598 A1* | 7/2016 | Hayashi ................. H02K 5/225 |
| 2016/0218599 A1* | 7/2016 | Hanft ................... H02K 11/048 |
| 2017/0008554 A1 | 1/2017 | Hirotani et al. |

(Continued)

FOREIGN PATENT DOCUMENTS

| EP | 3109599 A1 | 12/2016 |
| JP | 2012-195089 A | 10/2012 |
| WO | 2015/122069 A1 | 8/2015 |

OTHER PUBLICATIONS

Feb. 13, 2019 Extended Search Report issued in European Patent Application No. 18201190.8.

*Primary Examiner* — Forrest M Phillips
(74) *Attorney, Agent, or Firm* — Oliff PLC (57) ABSTRACT

A motor device that can secure the detection precision of the rotational angle of a motor is provided. A motor device has a motor housing, a heat sink, a motor cover, a motor, and a substrate. An opening portion of the motor housing is covered by the motor cover which is made of a magnetic body such as iron in a roofed tubular shape. A choke coil is provided on a surface of the substrate on the side opposite to the motor. A magnetic sensor is provided on a surface of the substrate on the side of the motor. A housing portion is provided at a roof portion of the motor cover. The choke coil, which is mounted on the substrate, is surrounded by the housing portion.

7 Claims, 5 Drawing Sheets

(56) References Cited

U.S. PATENT DOCUMENTS

2018/0198350 A1\* 7/2018 Ambo ..................... F04B 35/01
2019/0103784 A1\* 4/2019 Kamada ................. H02K 5/225
2019/0123621 A1\* 4/2019 Higashide .............. H02K 11/02

\* cited by examiner

MOTOR DEVICE

INCORPORATION BY REFERENCE

The disclosure of Japanese Patent Application No. 2017-202774 filed on Oct. 19, 2017 including the specification, drawings and abstract, is incorporated herein by reference in its entirety.

BACKGROUND OF THE INVENTION

1. Field of the Invention

The present invention relates to a motor device.

2. Description of the Related Art

There has hitherto been a motor device that includes a build-in control device that includes an inverter and a microcomputer as described in Japanese Patent Application Publication No. 2012-195089 (JP 2012-195089 A). The motor device has, as components that detect the rotational angle of a rotor, a magnet provided at a distal end portion of a rotary shaft that is rotatable together with the rotor and a magnetic sensor (rotational angle sensor) that faces a sensor magnet in the axial direction of the rotary shaft. The magnetic sensor generates an electric signal that matches variations in magnetic field that accompany rotation of the sensor magnet. The microcomputer computes the rotational angle of the rotary shaft of the motor on the basis of the electric signal which is generated by the magnetic sensor. The microcomputer controls energization of a motor coil by controlling a switching element of the inverter on the basis of the rotational angle.

In the motor which includes the build-in control device, a magnetic flux source is present besides the magnetic field of the sensor magnet which is the target to be detected by the magnetic sensor. Examples of the magnetic flux source include a choke coil that reduces electromagnetic noise or the like. Since a large current flows through the choke coil, the choke coil tends to generate a large magnetic field. Therefore, a magnetic field formed around the sensor magnet is distorted by the effect of a magnetic field (magnetic noise) formed around the choke coil, and a magnetic field detected by the magnetic sensor may be different from what it properly should be. That is, in the case where a magnetic field from the choke coil is applied to the magnetic sensor besides an ideal magnetic field from the sensor magnet, there may be an error between the rotational angle of the rotary shaft of the motor which is detected through the magnetic sensor and the actual rotational angle.

SUMMARY OF THE INVENTION

It is an object of the present invention to provide a motor device that can secure the detection precision of the rotational angle of a motor.

An aspect of the present invention provides a motor device including: a motor that has a rotary shaft; a motor housing in a bottomed tubular shape in which the motor is housed; a substrate on which various electronic components that control power supply to the motor are mounted; a motor cover in a roofed tubular shape in which the substrate is housed and which is provided so as to cover an opening portion of the motor housing; a sensor magnet provided at an end portion of the rotary shaft on a side of the substrate; a magnetic sensor provided on a surface of the substrate on a side of the motor so as to face the sensor magnet, the magnetic sensor generating an electric signal that matches a magnetic field from the sensor magnet; and a power source filter provided on the substrate on a side opposite to the motor as one of the various electronic components, the power source filter generating leakage flux, in which the motor cover is provided integrally with a wall portion that surrounds at least a portion of the power source filter on a side of the magnetic sensor.

With this configuration, interference of leakage flux generated from the power source filter with magnetic flux from the sensor magnet is suppressed with at least a portion of the power source filter on the side of the magnetic sensor surrounded by the wall portion. Consequently, a magnetic field formed around the sensor magnet is not likely to be distorted. Therefore, the magnetic sensor can generate an electric signal that matches an ideal magnetic field from the sensor magnet. Consequently, generation of an error between the rotational angle of the rotary shaft which is computed on the basis of the electric signal which is generated by the magnetic sensor and the actual rotational angle is suppressed, which makes it possible to secure the detection precision of the rotational angle of the rotary shaft of the motor.

According to another aspect of the present invention, the wall portion may be a housing portion that projects from a roof portion of the motor cover toward a side opposite to the motor; and at least a portion of the power source filter may be housed in the housing portion.

With this configuration, the power source filter is surrounded by the housing portion with the power source filter housed in the housing portion which is provided to the motor cover. Consequently, interference of leakage flux generated from the power source filter with magnetic flux from the sensor magnet is suppressed.

According to a further aspect of the present invention, the wall portion may have a portion that projects from a roof portion of the motor cover toward a side of the motor. With this configuration, interference of leakage flux generated from the power source filter with magnetic flux from the sensor magnet is suppressed with at least a portion of the power source filter on the side of the magnetic sensor surrounded by the portion which projects from the roof portion of the motor cover toward the side of the motor.

According to still another aspect of the present invention, the power source filter may be disposed at a marginal part of the substrate; and a part of the wall portion may constitute a part of a side surface of the motor cover. With this configuration, the wall portion is common to the side surface of the motor cover, which makes it possible to save the trouble in processing. In addition, the power source filter can be disposed at a position far from the magnetic sensor with the power source filter disposed at a marginal part of the substrate.

According to still another aspect of the present invention, the power source filter may be a choke coil that reduces electromagnetic noise. With this configuration, a large current flows through the choke coil, and therefore a large magnetic field is generated by the choke coil. Therefore, the magnetic sensor may be affected not only by a magnetic field formed around the sensor magnet, but also by a magnetic field formed around the choke coil. In this respect, interference of leakage flux generated from the choke coil with magnetic flux from the sensor magnet is suppressed with at least a portion of the choke coil on the side of the magnetic sensor surrounded by the wall portion.

According to still another aspect of the present invention, the wall portion may be provided so as to extend in an axial direction of the rotary shaft of the motor to a position where the wall portion overlaps a conductor portion of the choke coil when viewed from a first direction that is orthogonal to the direction of the axis and passes through the wall portion and the conductor portion. With this configuration, magnetic flux generated from the power source filter can be attracted to the motor cover more reliably.

According to still another aspect of the present invention, the substrate may be provided with a control device that controls drive of the motor.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
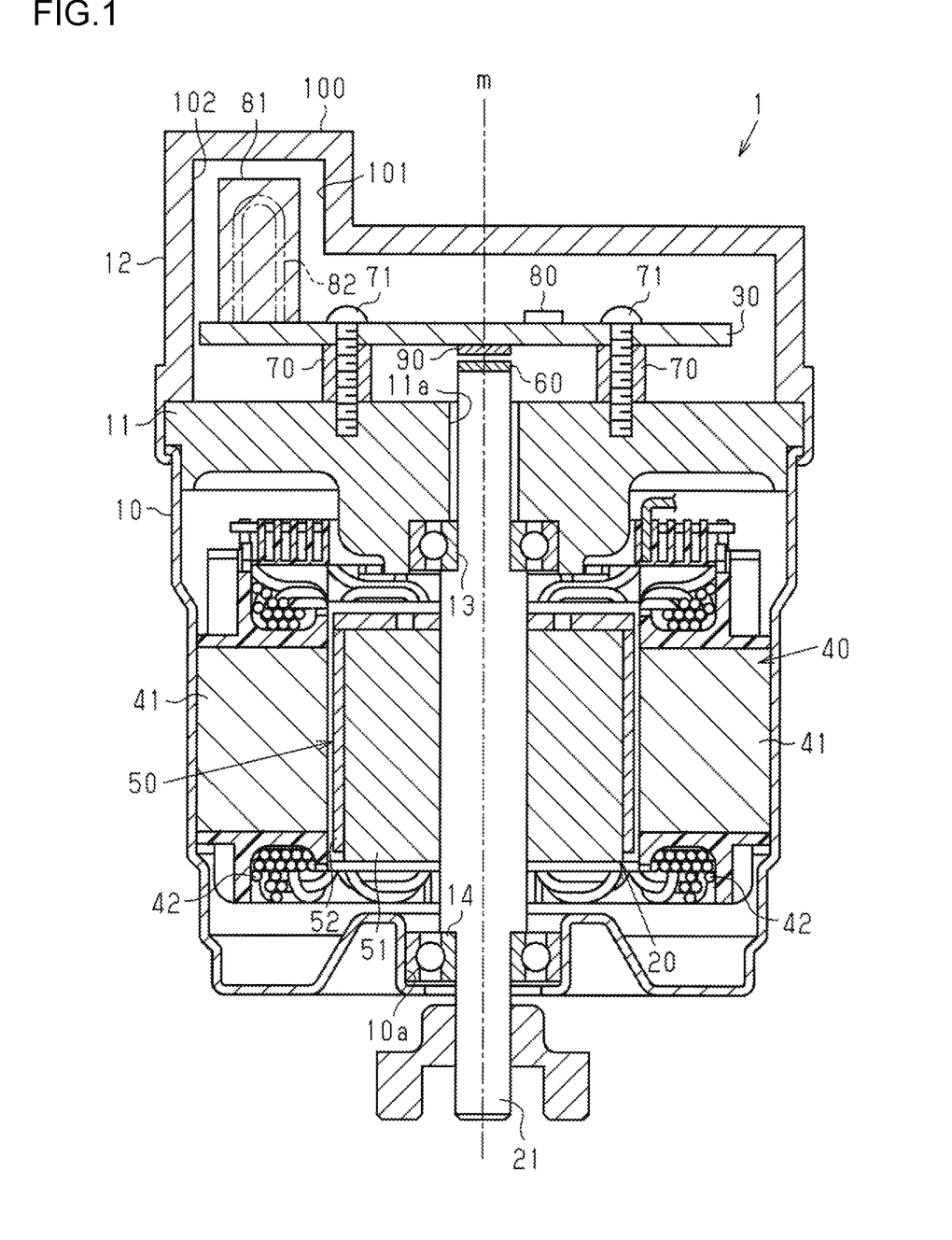
FIG. 1 is a sectional view of a motor device.

A motor device according to an embodiment of the present invention will be described below. As illustrated in FIG. 1, a motor device 1 has a motor housing 10, a heat sink 11, a motor cover 12, a motor 20, and a substrate 30.

The motor housing 10 has a bottomed cylindrical shape. The heat sink 11 is provided so as to block an opening portion (upper end portion in FIG. 1) of the motor housing 10. The heat sink 11 has an insertion hole 11a through which a rotary shaft 21 of the motor 20 is inserted. The motor 20 is housed inside the motor housing 10.

The motor 20 has a stator 40 fitted with an inner peripheral surface of the motor housing 10, a rotor 50 disposed at an inner periphery of the stator 40 with a clearance provided therebetween, and the rotary shaft 21 which is fitted with and fixed to an inner periphery of the rotor 50. The rotary shaft 21 extends along an axis m, and penetrates an bottom wall of the motor housing 10 and the heat sink 11. The rotary shaft 21 is supported so as to be rotatable with respect to the motor housing 10 and the heat sink 11 via two bearings 13 and 14. A second end portion (lower end portion in FIG. 1) of the rotary shaft 21 penetrates a housing hole 10a provided in the bottom portion of the motor housing 10 to extend to the outside.

The stator 40 has a cylindrical stator core 41 and a motor coil 42 wound around the stator core 41. The rotor 50 has an annular rotor core 51 attached so as to be rotatable together with the rotary shaft 21, and a tubular magnet 52 attached so as to be rotatable together with an outer periphery of the rotor core 51. The magnet 52 includes a plurality of magnets disposed side by side in the circumferential direction of the rotor core 51, for example. These magnets are disposed such that the magnetic poles (N pole and S pole) thereof are changed alternately in the circumferential direction of the rotor core 51.

A first end portion (upper end portion in FIG. 1) of the rotary shaft 21 projects to the outside via the insertion hole 11a of the heat sink 11. A sensor magnet 60 is provided at the first end portion of the rotary shaft 21. The sensor magnet 60 may be a two-pole magnet in a circular column shape, for example.

The substrate 30 is supported via spacers 70 on a surface (upper surface in FIG. 1) of the heat sink 11 on the side opposite to the motor 20. The substrate 30 and the spacers 70 are fixed to the heat sink 11 by screws 71. Various electronic components are mounted on the substrate 30. Examples of the electronic components include a microcomputer 80 that controls the motor 20 and a choke coil 81 (power source filter) that reduces electromagnetic noise. The microcomputer 80 and the choke coil 81 are provided on a surface of the substrate 30 on the side opposite to the motor 20. The choke coil 81 is provided on the substrate 30 at a position that is farthest from the axis m. The height of the choke coil 81 with reference to the substrate 30 in the direction of the axis m is set to be sufficiently larger than the height of the microcomputer 80. A magnetic sensor 90 is provided on a surface of the substrate 30 on the side of the motor 20 (heat sink 11) as a rotational angle sensor that detects the rotational angle of the rotary shaft 21 of the motor 20. The magnetic sensor 90 faces the sensor magnet 60, which is provided at the first end portion of the rotary shaft 21, in the axial direction (direction of the axis m) of the rotary shaft 21. The magnetic sensor 90 may be a magnetoresistive (MR) sensor such as an anisotropic magnetoresistive sensor. The magnetic sensor 90 generates an electric signal that matches the direction of a magnetic field applied from the sensor magnet 60. The microcomputer 80 computes the rotational angle of the rotary shaft 21 on the basis of the electric signal which is generated by the magnetic sensor 90, and controls power supply to the motor coil 42 on the basis of the computed rotational angle.

The opening portion of the motor housing 10 is covered by the motor cover 12 which is a roofed tubular body. The material of the motor cover 12 may be a magnetic body such as iron, for example. The motor cover 12 is attached to the motor housing 10 with the opening portion of the motor housing 10 and the opening portion of the motor cover 12 abutting against each other. By way of example, the motor cover 12 is fixed to the motor housing 10 with snap-fit lugs of the motor cover 12 engaging a flange at the opening end portion of the motor housing 10 in the axial direction. The heat sink 11 is fixed as interposed between the motor housing 10 and the motor cover 12. The motor housing 10 and the motor cover 12 may be fixed to each other by bolting or the like, rather than snap-fitting.

The sensor magnet 60, the magnetic sensor 90, the substrate 30, the microcomputer 80, and the choke coil 81 are housed inside the motor cover 12. A housing portion 100 is provided at a portion of the roof portion of the motor cover 12 corresponding to the choke coil 81. The housing portion 100 projects in the direction opposite to the motor 20 with respect to the roof portion of the motor cover 12. At least the distal end portion of the choke coil 81, which is mounted on the substrate 30, is housed in the housing portion 100. The magnetic sensor 90 and the choke coil 81 are preferably positioned as far as possible from each other.

Figure 2:
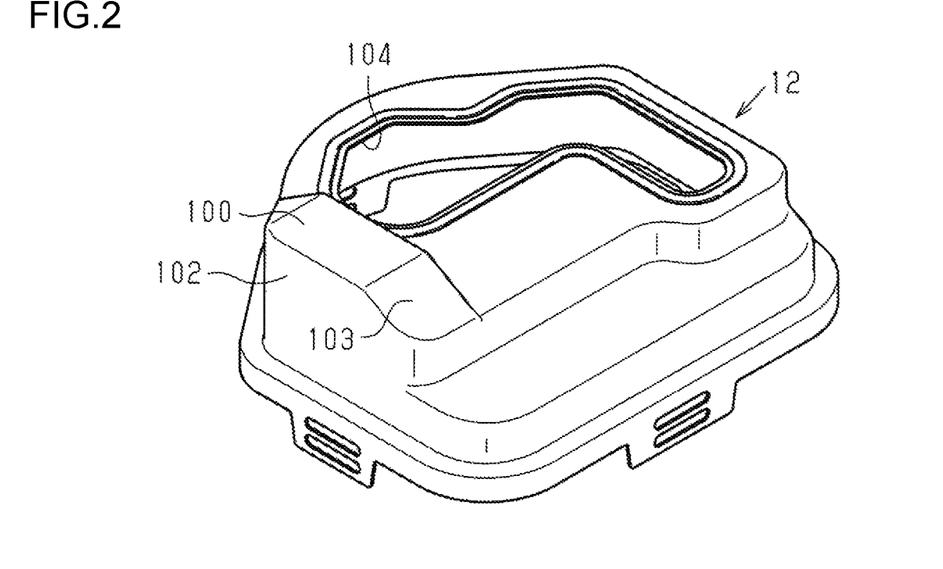
FIG. 2 is a perspective view of a motor cover according to a present embodiment.

As illustrated in FIG. 2, the housing portion 100 of the motor cover 12 has a generally rectangular parallelepiped shape. A part (common surface 102) of a side surface of the housing portion 100 is common to a side surface of the motor cover 12. In addition, an inclined portion 103 is provided between the roof wall of the housing portion 100 and a portion of the roof portion of the motor cover 12 at which the housing portion 100 is not provided. In addition, the portion of the roof portion of the motor cover 12 at which the housing portion 100 is not provided is provided with a hole 104 that allows passage of a connector (not illustrated) that allows the various electronic components which are mounted on the substrate 30 to be connected to an external device. The motor cover 12, which is made of a magnetic body such as iron, functions as a magnetic shield that blocks magnetic noise (leakage flux) of the motor device 1.

Next, the choke coil 81 will be described. The choke coil 81 may be various types of coils such as a closed magnetic circuit type and an open magnetic circuit type. A toroidal coil that has a ring-shaped core, for example, is known as a coil of the closed magnetic circuit type. A solenoid coil that has a linear (curved) core, for example, is known as a coil of the open magnetic circuit type. The choke coil 81 may be any of the toroidal coil and the solenoid coil.

Figure 3:
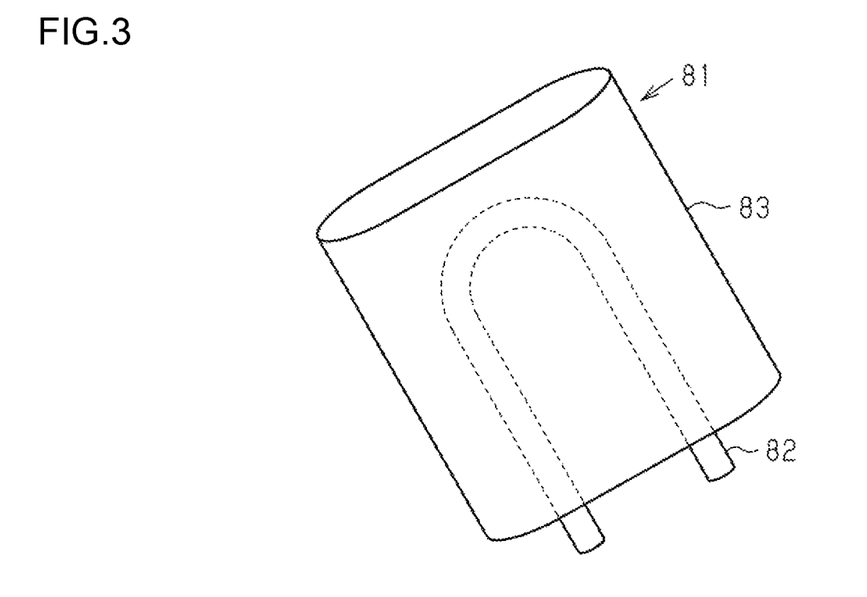
FIG. 3 is a perspective view of a choke coil.

In the present embodiment, as illustrated in FIG. 3, the choke coil 81 may be a solenoid coil (one-turn coil) of a lead wire (conductor) type, for example. The choke coil 81 has a conductor portion 82 that is wound one turn in a U-shape, and a casing portion 83 that houses the conductor portion 82. By way of example, the diameter of the conductor portion 82 is set to be large in accordance with the amount of a current that flows therethrough. A wall portion 101 preferably extends in the direction of the axis m to a position where the wall portion 101 overlaps the conductor portion 82 when viewed from a first direction that is orthogonal to the direction of the axis m and passes through the wall portion 101 and the conductor portion 82.

The function and the effect of the present embodiment will be described.

(1) A large current flows through the choke coil 81, and therefore a large magnetic field (leakage flux) is generated by the choke coil 81. Therefore, the magnetic sensor 90 may be affected not only by a magnetic field formed around the sensor magnet 60, but also by a magnetic field formed around the choke coil 81. For example, it is conceivable that the magnetic field which is formed around the sensor magnet 60 is distorted with magnetic flux from the choke coil 81 interfering with magnetic flux from the sensor magnet 60. It is also conceivable that magnetic flux from the choke coil 81 is applied to the magnetic sensor 90 besides ideal magnetic flux from the sensor magnet 60. In these cases, an error may be generated between the rotational angle of the rotary shaft 21 which is detected through the magnetic sensor 90 and the actual rotational angle.

Figure 4:
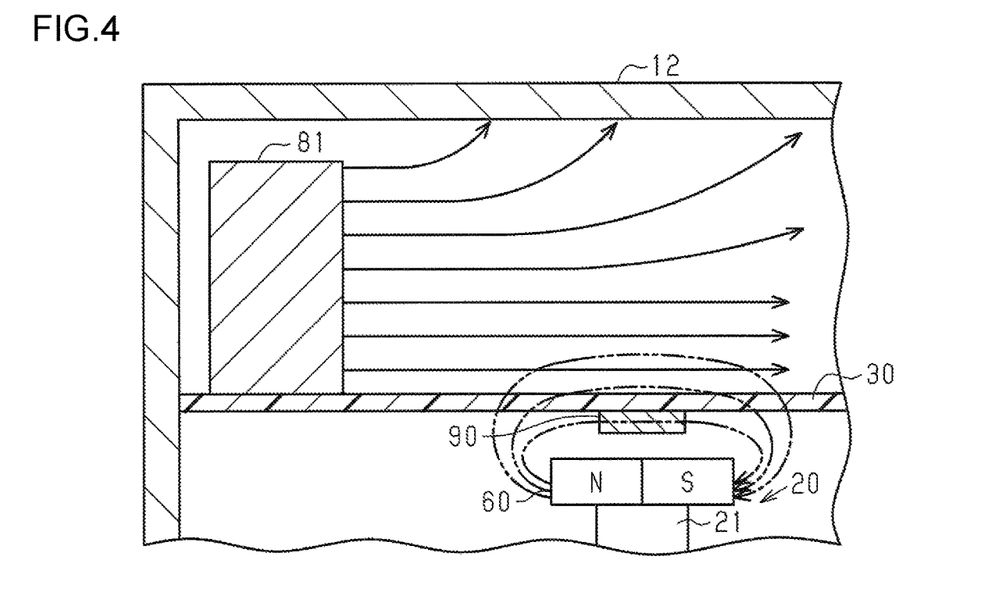
FIG. 4 is a sectional view of the motor device, illustrating a structure around the choke coil according to the present embodiment.

In the case where the motor cover 12 is not provided with the housing portion 100 and the choke coil 81 is not surrounded by the housing portion 100 as in a comparative example illustrated in FIG. 4, a magnetic field generated by the choke coil 81 affects a magnetic field formed around the magnetic sensor 90 and the sensor magnet 60. This is because a part of magnetic flux generated by the choke coil 81 on the side of the substrate 30 passes through the vicinity of the magnetic sensor 90 without being particularly attracted by a magnetic body, while a part of magnetic flux generated by the choke coil 81 on the side of the roof portion of the motor cover 12 (on the side of the upper surface in FIG. 4) is attracted by the motor cover 12 which is a magnetic body. As a result, an error may be generated also in the rotational angle of the rotary shaft 21 which is detected by the magnetic sensor 90.

Figure 5:
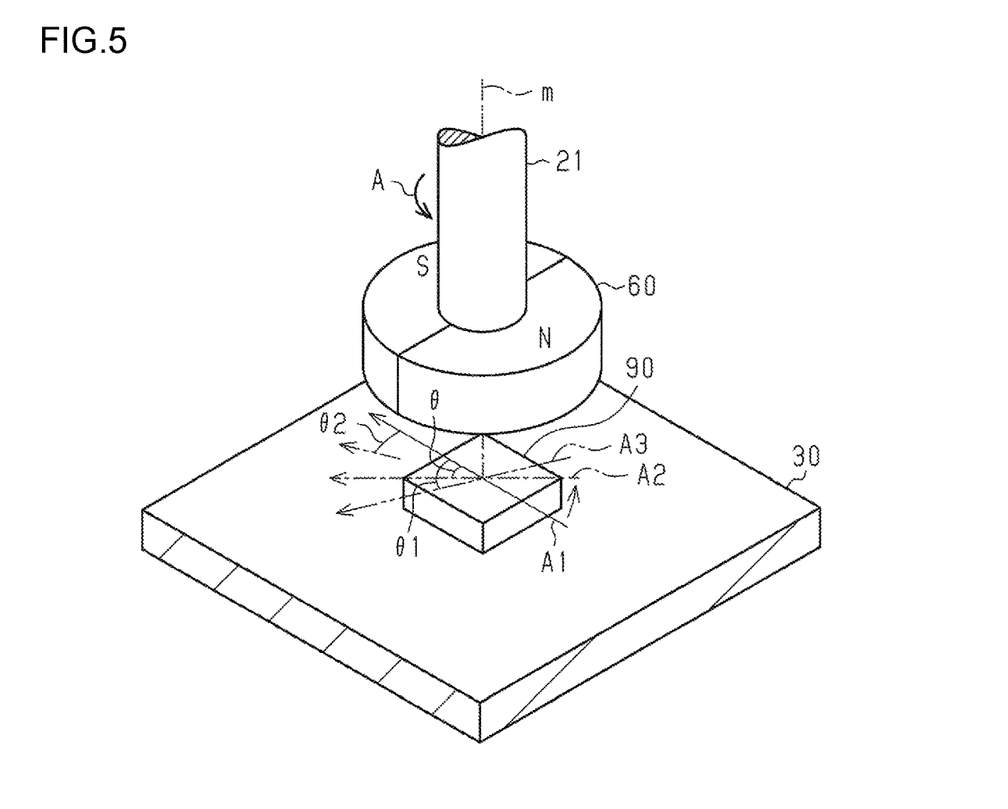
FIG. 5 is a perspective view of a rotational angle sensor.

As illustrated in FIG. 5, when the rotary shaft 21 is rotated by a rotational angle θ from the position indicated in the drawing in the direction indicated by the arrow A, for example, the direction of a magnetic field of the sensor magnet 60 applied to the magnetic sensor 90 should properly be varied by the rotational angle θ about the axis m from the direction indicated by the continuous line arrow A1 to the direction indicated by the long dashed short dashed line arrow A2. In the case where an ideal magnetic field from the sensor magnet 60 is affected by magnetic flux from the choke coil 81, however, the direction of a magnetic field applied to the magnetic sensor 90 is not the proper direction indicated by the arrow A2, but is the direction indicated by the long dashed double-short dashed line arrow A3, for example. The direction indicated by the arrow A3 may be a direction rotated by a rotational angle θ1 which is larger than the rotational angle θ, or a direction rotated by a rotational angle θ2 which is smaller than the rotational angle θ, from the direction indicated by the continuous line arrow A1 in FIG. 5. Therefore, the magnetic sensor 90 may generate an electric signal that matches the rotational angle θ1 or the rotational angle θ2, rather than the proper rotational angle θ. Consequently, an error may be generated between the rotational angle of the rotary shaft 21 which is detected through the magnetic sensor 90 and the actual rotational angle.

Figure 6:
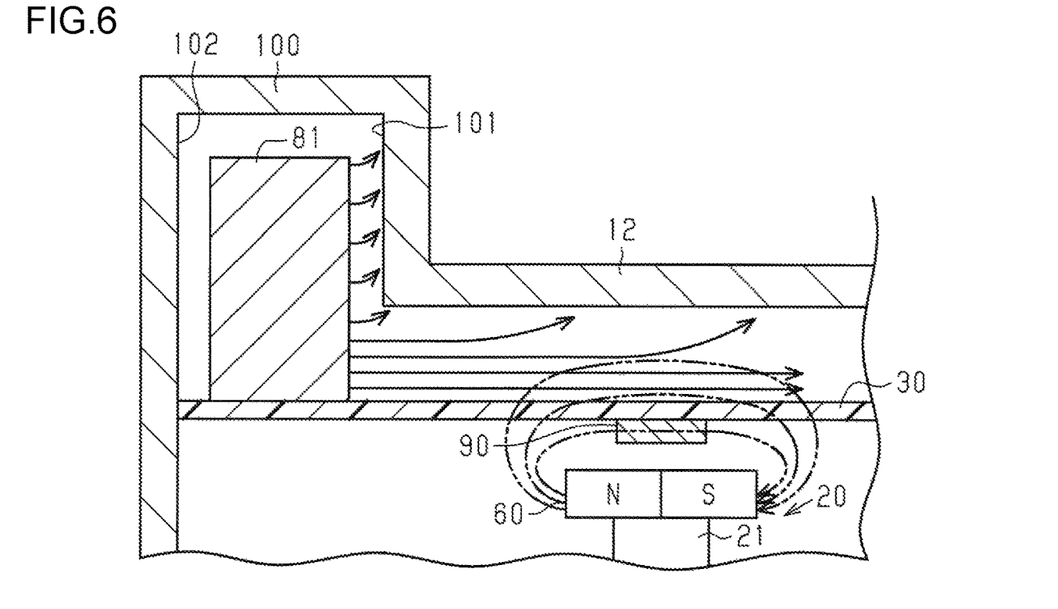
FIG. 6 is a sectional view of a motor device, illustrating a structure around a choke coil according to a comparative example.

In the present embodiment, in contrast, as illustrated in FIG. 6, the choke coil 81 is surrounded by the housing portion 100 of the motor cover 12. Consequently, at least a portion of the choke coil 81 on the side of the magnetic sensor 90 is surrounded by the housing portion 100 (wall portion 101). That is, with the wall portion 101 provided adjacent to the choke coil 81 in a direction (right-left direction in FIG. 6) that is orthogonal to the axial direction of the rotary shaft 21, magnetic flux generated by the choke coil 81 is attracted to the wall portion 101 (motor cover 12). Magnetic flux generated by the choke coil 81 tends to flow in the motor cover 12 which is a magnetic body, rather than in the air. This is because a magnetic body has a higher magnetic permeability than that of air. Therefore, with the choke coil 81 surrounded by the housing portion 100, magnetic flux generated by the choke coil 81 is guided to the wall portion 101 so that magnetic flux generated by the choke coil 81 is not likely to pass around the magnetic sensor 90 and the sensor magnet 60.

In this manner, with the choke coil 81 surrounded by the housing portion 100, interference of magnetic flux from the choke coil 81 with magnetic flux from the sensor magnet 60 is suppressed, and thus a magnetic field formed around the sensor magnet 60 is not likely to be distorted. Consequently, the magnetic sensor 90 can generate an electric signal that matches an ideal magnetic field from the sensor magnet 60. In addition, application of magnetic flux from the choke coil 81 to the magnetic sensor 90, besides ideal magnetic flux from the sensor magnet 60, can be suppressed. Consequently, the magnetic sensor 90 can generate an electric signal that matches the proper rotational angle θ of the rotary shaft 21. Therefore, generation of an error between the rotational angle of the rotary shaft 21 which is detected through the magnetic sensor 90 and the actual rotational angle is suppressed, which makes it possible to secure the detection precision of the rotational angle of the rotary shaft 21 of the motor 20.

(2) The common surface 102 functions both as a side surface of the motor cover 12 and as a portion of the housing portion 100, which makes it possible to save the trouble in processing.

(3) With the choke coil 81 mounted at a marginal portion of the substrate 30, the choke coil 81 is provided at an end portion of the substrate 30 that is the farthest from the sensor magnet 60 and the magnetic sensor 90. A magnetic field generated from the choke coil 81 is reduced in inverse proportion to the square of the distance. Thus, magnetic flux generated by the choke coil 81 is not caused to be likely to pass around the magnetic sensor 90 and the sensor magnet 60 by placing the choke coil 81 as far as possible from the sensor magnet 60 and the magnetic sensor 90. Consequently, generation of an error between the rotational angle of the rotary shaft 21 which is detected through the magnetic sensor 90 and the actual rotational angle is suppressed, which makes it possible to secure the detection precision of the rotational angle of the rotary shaft 21 of the motor 20.

(4) The wall portion 101 which extends from the roof portion of the housing portion 100 toward the motor 20 preferably extends in the direction of the axis m to the position where the wall portion 101 overlaps the conductor portion 82 when viewed from the first direction that is orthogonal to the direction of the axis m and passes through the wall portion 101 and the conductor portion 82 of the choke coil 81. With reference to the choke coil 81 illustrated in FIG. 3, magnetic flux generated from the choke coil 81 can be attracted more reliably by providing the wall portion 101 so as to overlap at least the top portion of the conductor in the U-shape when viewed from the first direction.

The present embodiment may be modified as follows. The following other embodiments may be combined with each other as long as the embodiments do not technically contradict with each other. The magnetic sensor 90 may be a Hall sensor rather than an MR sensor.

The material of the motor cover 12 is not limited to iron, and may be any magnetic body. In the present embodiment, interference of magnetic flux from the choke coil 81 with magnetic flux from the sensor magnet 60 is suppressed by the housing portion 100 surrounding the choke coil 81. However, the present invention is not limited thereto.

Figure 7:
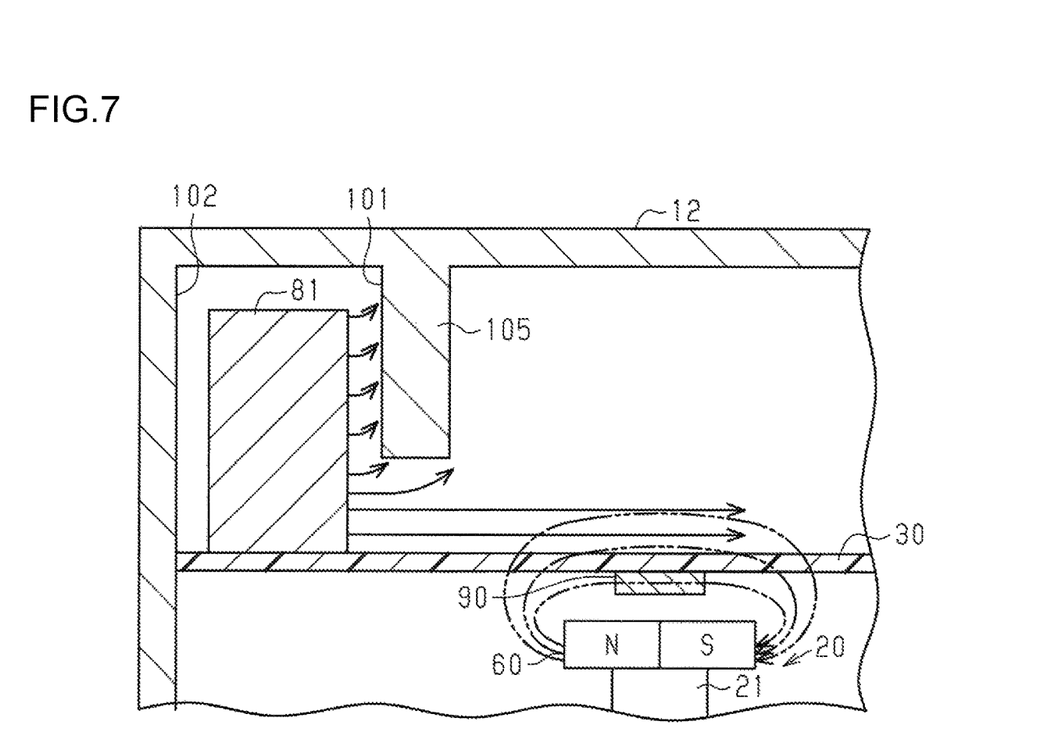
FIG. 7 is a sectional view of a motor device, illustrating a structure around a choke coil according to a different embodiment.

For example, interference of magnetic flux from the choke coil 81 with magnetic flux from the sensor magnet 60 may be suppressed by providing the roof portion of the motor cover 12 integrally with a wall portion 105 that extends toward the motor as illustrated in FIG. 7. That is, the wall portion 105 may be disposed at least on the side of the sensor magnet 60 with respect to the choke coil 81.

In the present embodiment, the magnetic sensor 90 is mounted on a surface of the substrate 30 on the side of the motor 20, and the choke coil 81 is mounted on a surface of the substrate 30 on the side opposite to the motor 20. However, the present invention is not limited thereto. That is, it is only necessary that the choke coil 81 should be provided on the side opposite to the motor 20 with respect to the substrate 30, and the choke coil 81 may be mounted on a different substrate that is orthogonal to the substrate 30, for example.

Figure 8:
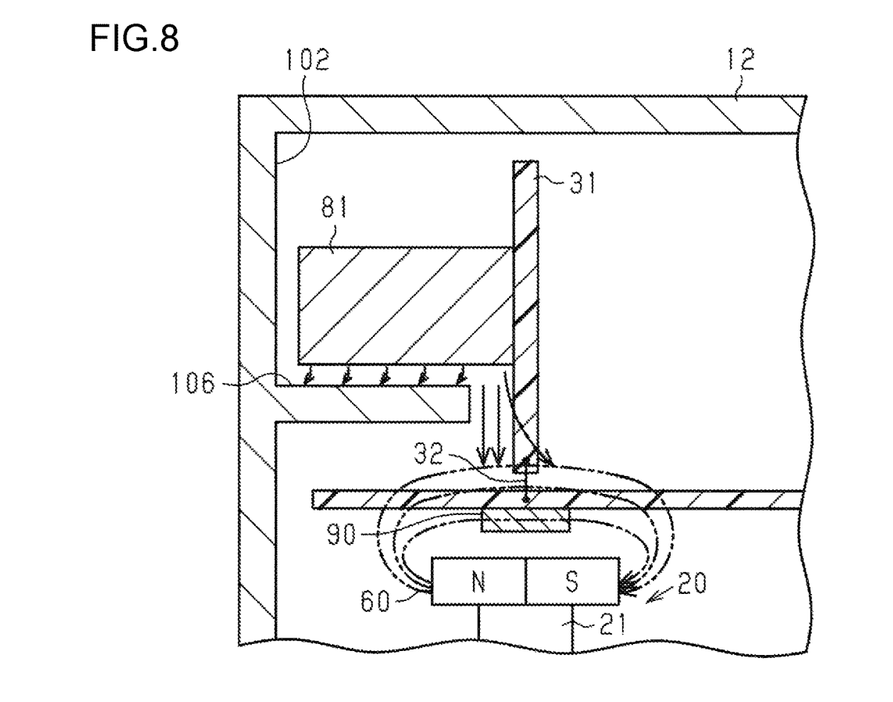
FIG. 8 is a sectional view of a motor device, illustrating a structure around a choke coil according to a different embodiment.

As illustrated in FIG. 8 by way of example, the choke coil 81 may be disposed on a substrate 31 provided orthogonally to the substrate 30. The substrate 30 and the substrate 31 may be electrically connected to each other by a relay circuit 32, for example. In addition, the substrate 31 is fixed to a heat sink (not illustrated), for example. The motor cover 12 is provided integrally with a wall portion 106. The wall portion 106 is provided on the side of the magnetic sensor 90 with respect to the choke coil 81 (below the choke coil 81 in FIG. 8). That is, the wall portion 106 is provided between the choke coil 81 and the substrate 30 (magnetic sensor 90) in the axial direction of the rotary shaft 21 of the motor 20. Consequently, interference of magnetic flux from the choke coil 81 with magnetic flux from the sensor magnet 60 is suppressed.

Figure 9:
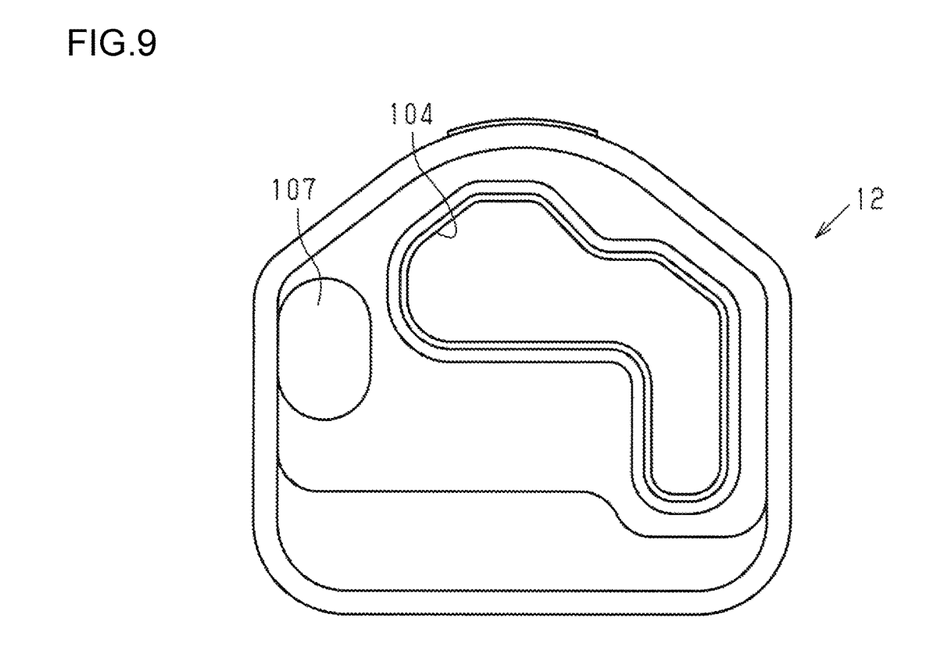
FIG. 9 is a top view of a motor cover according to a different embodiment.

In the present embodiment, the housing portion 100 has a generally rectangular parallelepiped shape. However, the present invention is not limited thereto. For example, as illustrated in FIG. 9, the motor cover 12 may be provided with a housing portion 107 that has a generally oval column shape. Also in this case, the choke coil 81 is surrounded by the housing portion 107. In the case where the choke coil 81 in an oval column shape is adopted, the choke coil 81 can be housed in the housing portion 107 with no wasteful space taken between the housing portion 107 and the choke coil 81. In this manner, it is only necessary that the housing portion 107 should have a shape that matches the outer shape of the choke coil 81. For example, in the case where the choke coil 81 has the shape of a regular hexahedron, the motor cover 12 may be provided with a housing portion that has the shape of a regular hexahedron.

In the present embodiment, the microcomputer 80 is provided on the substrate 30. However, the microcomputer 80 may not be provided on the substrate 30. That is, the microcomputer 80 may be provided outside the motor device. A similar issue may occur with a motor device in which the choke coil 81 and an inverter circuit are disposed in the motor housing 10 and the motor cover 12.

In the present embodiment, the choke coil 81 is mounted on the substrate 30. However, the present invention is not limited thereto. For example, a capacitor or a coil that reduces electromagnetic noise may be mounted on the substrate 30. That is, it is only necessary that a power source filter that reduces electromagnetic noise should be mounted on the substrate 30.

What is claimed is:

1. A motor device comprising:
   a motor that has a rotary shaft;
   a motor housing in a bottomed tubular shape in which the motor is housed;
   a substrate on which various electronic components that control power supply to the motor are mounted;
   a motor cover in a roofed tubular shape in which the substrate is housed and which is provided so as to cover an opening portion of the motor housing;
   a sensor magnet provided at an end portion of the rotary shaft on a side of the substrate;
   a magnetic sensor provided on a surface of the substrate on a side of the motor so as to face the sensor magnet, the magnetic sensor generating an electric signal that matches a magnetic field from the sensor magnet; and
   a power source filter provided on the substrate on a side opposite to the motor as one of the various electronic components, the power source filter generating leakage flux, wherein
   the motor cover is provided integrally with a wall portion that surrounds at least a portion of the power source filter on a side of the magnetic sensor,
   the wall portion is a housing portion that projects from a roof portion of the motor cover toward a side opposite to the motor, at least a portion of the power source filter is housed in the housing portion, and
the motor cover is made of a magnetic body.

2. The motor device according to claim 1, wherein
the wall portion has a portion that projects from a roof portion of the motor cover toward a side of the motor.

3. The motor device according to claim 1, wherein:
the power source filter is disposed at a marginal part of the substrate; and
a part of the wall portion constitutes a part of a side surface of the motor cover.

4. The motor device according to claim 1, wherein
the power source filter is a choke coil that reduces electromagnetic noise.

5. The motor device according to claim 1, wherein
the wall portion is provided so as to extend in an axial direction of the rotary shaft of the motor to a position where the wall portion overlaps a conductor portion of the choke coil when viewed from a first direction that is orthogonal to the direction of the axis and passes through the wall portion and the conductor portion.

6. The motor device according to claim 1, wherein
the substrate is provided with a control device that controls drive of the motor.

7. The motor device according to claim 5, wherein:
the substrate has a portion that extends in an axial direction of the rotary shaft;
the choke coil is mounted in a direction that is orthogonal to the axial direction on the portion of the substrate which extends in the axial direction; and
the motor cover is provided with the wall portion which extends in the direction that is orthogonal to the axial direction so as to surround at least a portion of the choke coil on a side of the magnetic sensor.

* * * * *